(12) United States Patent
Namgoong et al.

(10) Patent No.: US 7,376,209 B2
(45) Date of Patent: May 20, 2008

(54) METHOD AND APPARATUS FOR NEAR-OPTIMAL SCALING OF LOG-LIKELIHOOD RATIO (LLR) COMPUTATION IN TURBO DECODING FOR HYBRID AUTOMATIC REPEAT REQUEST (ARQ)

(75) Inventors: June Namgoong, San Diego, CA (US); Jun Ma, San Diego, CA (US); Mingxi Fan, San Diego, CA (US); Naga Bhushan, San Diego, CA (US); Peter Black, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 870 days.

(21) Appl. No.: 10/456,148

(22) Filed: Jun. 6, 2003

(65) Prior Publication Data

US 2004/0258139 A1 Dec. 23, 2004

(51) Int. Cl.
*H03D 1/00* (2006.01)
*H04L 27/06* (2006.01)

(52) U.S. Cl. .............. 375/341; 370/912; 714/795
(58) Field of Classification Search ................ 714/791, 714/792, 793, 794, 795; 375/341; 370/912
See application file for complete search history.

(56) References Cited

U.S. PATENT DOCUMENTS

| 7,003,709 B2 * | 2/2006 | Wengerter et al. .......... 714/748 |
| 2003/0076870 A1 * | 4/2003 | Moon et al. ................. 375/130 |
| 2003/0097629 A1 * | 5/2003 | Moon et al. ................. 714/751 |

OTHER PUBLICATIONS

Worm, Alexander et al. *"Turbo-Decoding Without SNR Estimation,"* IEEE Communications Letter, 4(6): 193-195, 2000.

* cited by examiner

*Primary Examiner*—Curtis B. Odom
(74) *Attorney, Agent, or Firm*—Lee Hsu; Jonathan T. Velasco; Thomas R. Rouse

(57) ABSTRACT

A method and an apparatus for scaling demodulated data symbols contained in a packet to generate scaled log-likelihood ratios for Turbo decoding are disclosed. A packet consists of one or more subpackets depending on the type of packet. Each subpacket is identified by a subpacket identification number. The payload size of the packet and the subpacket identification number may be determined by decoding a reverse rate indicator (RRI) channel. A scale factor which is associated with a specific subpacket identification number and a specific payload size results in a performance measure that is closest to an expected performance measure. The scale factor is used for scaling the demodulated data symbols to generate scaled log-likelihood ratios for Turbo decoding.

67 Claims, 3 Drawing Sheets

METHOD AND APPARATUS FOR NEAR-OPTIMAL SCALING OF LOG-LIKELIHOOD RATIO (LLR) COMPUTATION IN TURBO DECODING FOR HYBRID AUTOMATIC REPEAT REQUEST (ARQ)

BACKGROUND

1. Field of the Invention

The present invention relates generally to telecommunications, and more specifically, to wireless communications.

2. Background

In an enhanced reverse link scheme, four different types of packets may be transmitted from a mobile station or an access terminal (AT) to a base station. The packets transmitted through the reverse link may have different physical layer packet lengths, for example, four slots, eight slots, twelve slots or sixteen slots, depending on the type of the packet. An access terminal may desire to transmit a packet shorter than sixteen slots while still achieving the same packet error rate (PER) as that of a sixteen-slot packet. For example, it may be desirable to achieve a PER of 1% regardless of the number of slots in the transmitted packet.

When an AT transmits a packet that has a length of less than four subpackets, each of the subpackets consisting of four slots, the AT boosts the traffic-to-pilot (T2P) ratio of the transmitted subpackets to overcome the loss of ratio of bit energy to noise power spectral density ($E_b/N_0$), coding gain and time diversity. The T2P ratio is conventionally defined as the ratio of the chip energy of the data channel ($E_{c,\,data}$) to the chip energy of the pilot ($E_{cp}$).

The base station may be able to estimate the physical layer payload size by decoding a reverse rate indicator (RRI) channel in a conventional manner known to a person skilled in the art. However, the base station does not know a priori whether the received subpacket is boosted in power by the AT. The lack of a priori knowledge by the base station may cause a problem in Turbo decoding because unlike a conventional Viterbi convolutional decoder, a Turbo decoder requires knowledge of the signal-to-noise ratio (SNR) information in computing a log-likelihood ratio (LLR). Hence, some mechanism is needed for properly computing the LLR for the Turbo decoder.

The LLR required for Turbo decoding is typically proportional to the SNR of demodulated data received by the base station, which may be expressed as the ratio of chip energy of the data ($E_{c,\,data}$) to the effective noise power spectral density ($N_t$) at the base station antenna. Because demodulated data obtained by maximal ratio combining (MRC) are proportional to $(E_{cp}/N_t)\cdot\text{sqrt}(T2P)$, the demodulated data symbol needs to be scaled by the square root of T2P in a conventional scheme of LLR computation. A typical approach of obtaining the LLR for the Turbo decoder is to calculate the estimated T2P ratio from the ratio of SNR of the data symbols to that of the pilot symbols every time a subpacket is received by the base station and then to map the estimated T2P ratio to one of the four choices of packet lengths. However, this approach entails setting decision boundaries which may vary according to the type of physical channel and may be computationally inefficient.

Therefore, there is a need in the art for a more efficient but near-optimal approach to LLR computation for the Turbo decoder.

SUMMARY

Embodiments disclosed herein address the above stated needs by determining a subpacket identification number for a most recently received subpacket of a given packet, the subpacket identification number associated with a scale factor which results in a performance measure that is closest to an expected performance measure, and applying the scale factor to demodulated data symbols in the packet to compute scaled log-likelihood ratios.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

A subscriber station, referred to herein as an access terminal (AT), may be mobile or stationary, and may communicate with one or more base stations, referred to herein as modem pool transceivers (MPTs). An access terminal transmits and receives data packets through one or more modem pool transceivers to a base station controller, referred to herein as a modem pool controller (MPC). Modem pool transceivers and modem pool controllers are parts of a network called an access network. An access network transports data packets between multiple access terminals. The access network may be further connected to additional networks outside the access network, such as a corporate intranet or the Internet, and may transport data packets between each access terminal and such outside networks. An access terminal that has established an active traffic channel connection with one or more modem pool transceivers is called an active access terminal, and is said to be in a traffic state. An access terminal that is in the process of establishing an active traffic channel connection with one or more modem pool transceivers is said to be in a connection setup state. An access terminal may be any data device that communicates through a wireless channel or through a wired channel, for example, using fiber optic or coaxial cables. An access terminal may further be any of a number of types of devices including but not limited to PC card, compact flash, external or internal modem, or wireless or wireline telephone. The communication link through which the access terminal sends signals to the modem pool transceiver is called a reverse link. The communication link through which a modem pool transceiver sends signals to an access terminal is called a forward link.

Figure 1:
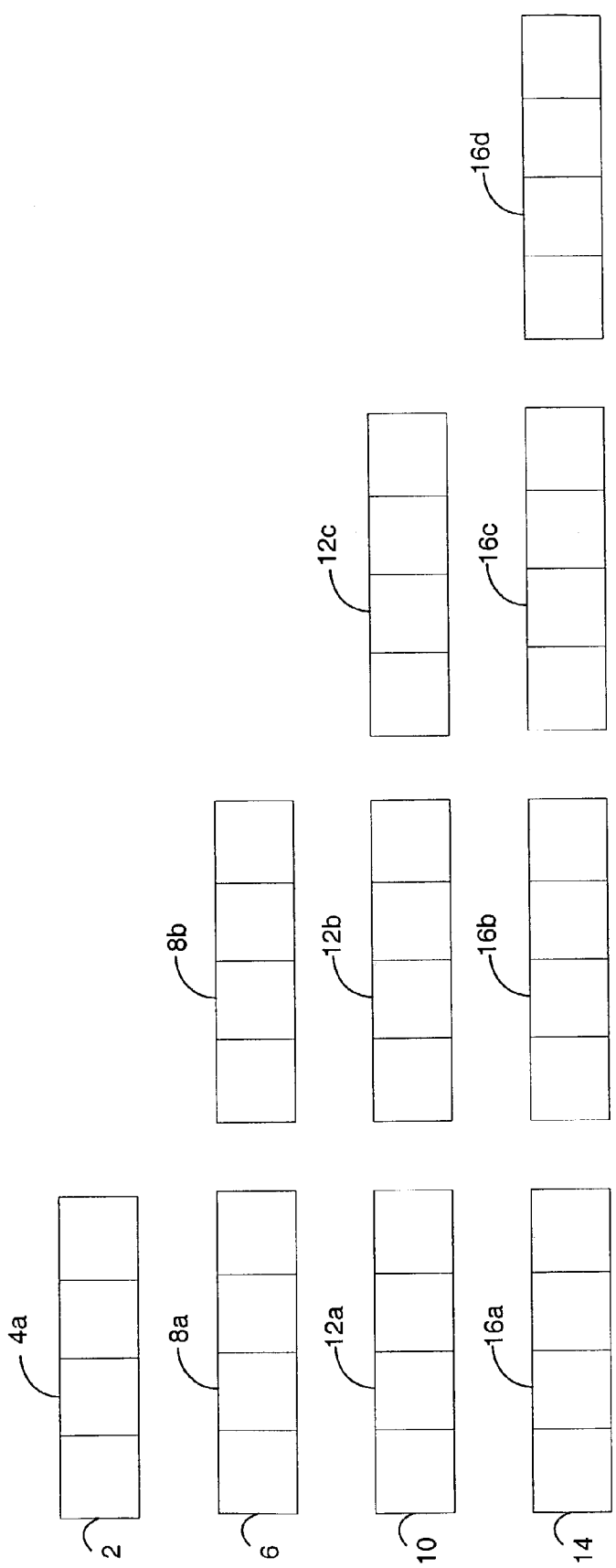
FIG. 1 is a diagram illustrating four types of packets each consisting of a different number of subpackets which may be transmitted through a reverse link from an access terminal to a base station.

FIG. 1 is a diagram illustrating four types of packets. The first type of packet 2 consists of a single subpacket 4a and terminates at the end of the subpacket 4a. The second type of packet 6 consists of two subpackets 8a and 8b and terminates at the end of subpacket 8b. The third type of packet 10 consists of three subpackets 12a, 12b and 12c and terminates at the end of subpacket 12c. The fourth type of packet 14 is a "full-size" packet which consists of four subpackets 16a, 16b, 16c and 16d. Each of the subpackets consists of four time slots regardless of the packet type.

In an embodiment, each subpacket in a given packet is identified by a subpacket identification number, also called a subpacket index, for indicating the sequential position of each subpacket in the packet regardless of the number of subpackets contained in the packet. For example, the first subpacket of a packet may be assigned subpacket identification number 0, the second subpacket succeeding the first subpacket may be assigned subpacket identification number 1, the third subpacket succeeding the second subpacket may be assigned subpacket identification number 2, and the fourth subpacket succeeding the third subpacket may be assigned subpacket identification number 3. In FIG. 1, subpacket identification number 0 is assigned to the first subpackets 4a, 8a, 12a and 16a of the first, second, third and fourth types of packets 2, 6, 10 and 14, respectively. In a similar manner, subpacket identification number 1 is assigned to the second subpackets 8b, 12b and 16b of the second, third and fourth types of packets 6, 10 and 14, respectively. Furthermore, subpacket identification number 2 is assigned to the third subpackets 12c and 16c of the third and fourth types of packets 10 and 14, respectively, while subpacket identification number 3 is assigned only to the last subpacket 16d of the fourth type of packet 14.

Figure 2:
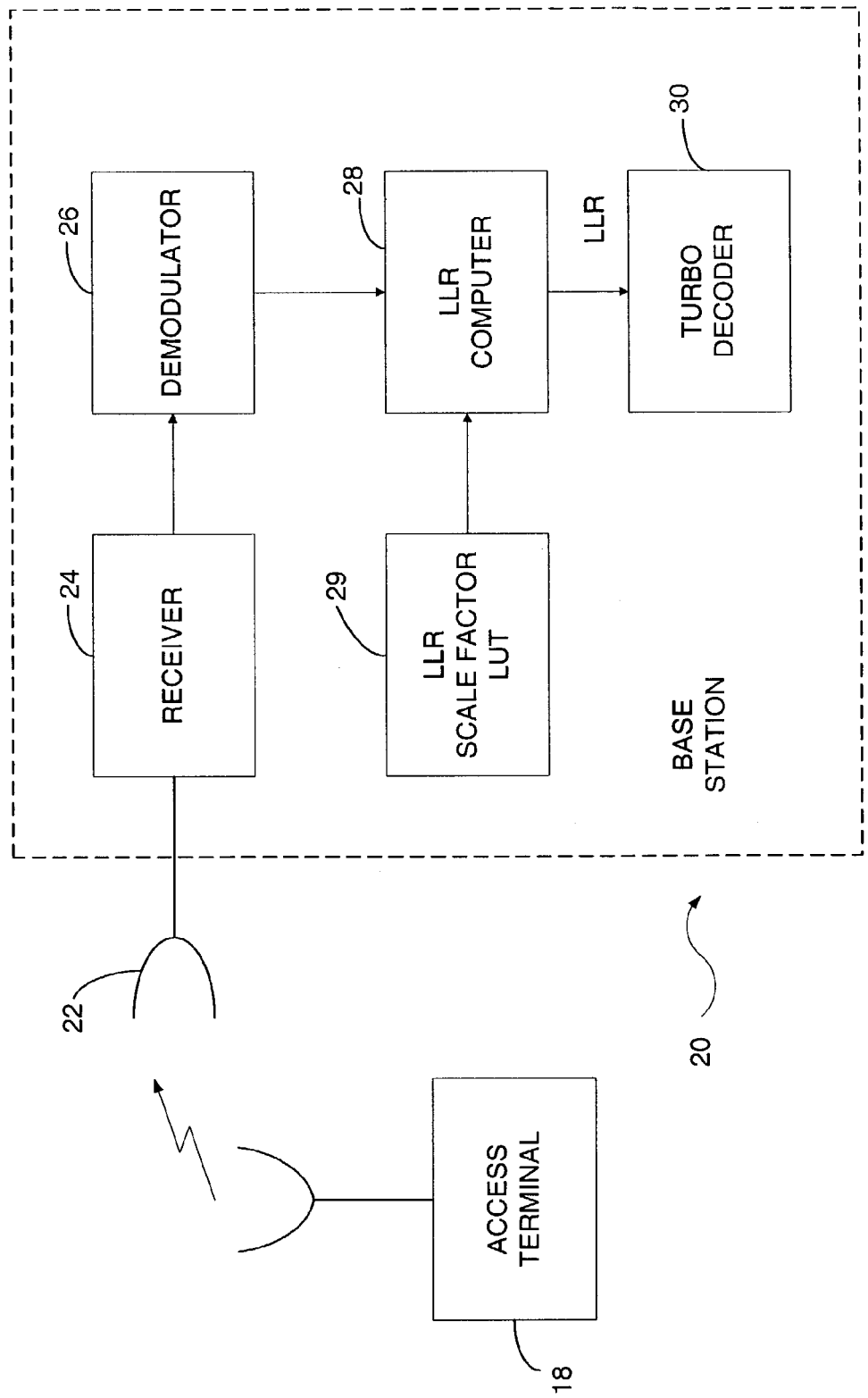
FIG. 2 is a simplified block diagram illustrating a wireless communications system in which embodiments of the present invention may be implemented.

FIG. 2 is a block diagram illustrating a wireless communications system which includes an access terminal (AT) 18 and a base station 20. The AT 18 may transmit packets of any of the packet types illustrated in FIG. 1 in a reverse link to the base station. Each packet transmitted by the AT 18 may or may not terminate early and may include as few as one and as many as four subpackets. In a typical enhanced reverse link scheme, the subpacket identification number of each subpacket in a given packet and the payload size of the given packet are transmitted from the AT 18 to the base station 20 through a reverse rate indicator (RRI) channel. However, the base station 20 does not have a priori knowledge of the type of packet or how many subpackets are contained in any given packet transmitted by the AT 18.

In order for the base station 20 to receive data from the AT 18 in a reverse link, the base station 20 typically includes an antenna 22, a receiver 24 connected to the antenna 22 for converting spread-spectrum radio frequency (RF) signals received by the antenna 22 to despread signals, and a demodulator 26 for demodulating the despread signals to extract data. A typical receiver may include various elements well known to a person skilled in the art, such as a pseudo-noise (PN) despreader in a direct sequence (DS) code division multiple access (CDMA) system, for example. In an embodiment, the demodulator 26 comprises a maximal ratio combiner (MRC) to extract received data from the despread signals by using a maximal ratio combining technique which is well known to a person skilled in the art.

In order to decode the data by Turbo decoding, the base station 20 also includes a log-likelihood ratio (LLR) computer 28 connected to the demodulator 26 and an LLR scale factor look-up table (LUT) 29 connected to the LLR computer 28 in an embodiment to generate scaled log-likelihood ratios for Turbo decoding. A Turbo decoder 30 is connected to the LLR computer 28 to decode the MRC demodulated data based on the scaled log-likelihood ratios. A Turbo code typically includes a combination of recursive systematic convolutional (RSC) codes, interleaving, and iterative decoding capable of approaching Shannon's limit of channel capacity. Turbo decoders are well known to a person skilled in the art. In addition to the receiver 24, the demodulator 26, the LLR computer 28, the LLR scale factor LUT 29 and the Turbo decoder 30 shown in FIG. 2, the base station 20 typically also includes various other elements which may be implemented by those of ordinary skill in the art.

In an embodiment, the LLR scale factor LUT 29 and the LLR computer 28 in FIG. 2 are implemented at the base station 20 to perform the function of generating scaled log-likelihood ratios. More particularly, the LLR scale factor LUT 29 provides a scale factor that represents a near-optimal choice for a given subpacket to the LLR computer 28 to compute the scaled log-likelihood ratio. In an embodiment, the scale factor is selected from a plurality of predetermined scale factors stored in the LLR scale factor LUT 29.

For a given payload size, the predetermined scale factors may be calculated by determining a traffic-to-pilot (T2P) ratio for each of the four packet types to achieve a predetermined fixed packet error rate (PER), for example, a PER of 1%. For a packet of n slots, where n may be, for example, 4, 8, 12 or 16, the T2P ratio required to achieve a PER of 1% is denoted as $P_n$. For subpacket identification number (id)=0, four possibilities $P_4$, $P_8$, $P_{12}$ and $P_{16}$ exist as potential choices for the scale factor. In a similar manner, for subpacket id=1, three possibilities $P_8$, $P_{12}$ and $P_{16}$ exist as potential choices for the scale factor. For a specific payload size, the different sets of hypotheses for the four subpacket identification numbers are summarized as follows:

Subpacket id=0: T2P $\in \{P_4, P_8, P_{12}, P_{16}\}$
Subpacket id=1: T2P $\in \{P_8, P_{12}, P_{16}\}$
Subpacket id=2: T2P $\in \{P_{12}, P_{16}\}$
Subpacket id=3: T2P $\in \{P_{16}\}$ The payload size is the number of information bits in a packet before being encoded by a Turbo encoder. For each payload size, there is a set of T2P ratios for a four-slot packet, an eight-slot packet, a twelve-slot packet and a sixteen-slot packet. The payload size of a given packet is not related to the number of slots in the packet. For example, for a payload size of 256 bits, there is a set of T2P ratios $P_4$, $P_8$, $P_{12}$ and $P_{16}$ for a packet of 4, 8, 12 and 16 slots, respectively, whereas for a payload size of 512 bits, there is a distinct set of T2P ratios $P_4'$, $P_8'$, $P_{12}'$ and $P_{16}'$ for a packet of 4, 8, 12 and 16 slots, respectively.

When the AT transmits a packet shorter than the "full-size" packet of four subpackets or sixteen slots, the T2P ratio of the transmitted packet is typically boosted to compensate for the loss of $E_b/N_0$, coding gain and time diversity in order to achieve the same PER. In this scenario, the AT is said to be transmitting in a power boosted mode. In a reverse link, it is typical that $P_4 > P_8 > P_{12} > P_{16}$, where $P_{16}$ is the T2P ratio of the full-size packet when the AT transmits in a non-power boosted mode.

In an embodiment, a fixed number is selected as a scale factor for each subpacket identification number for a given payload size, and a set of four scale factors are chosen regardless of whether each subpacket was transmitted by the AT in a power boosted mode. For subpacket id=0, 1, 2 and 3, the set of four scale factors are denoted as $\lambda_0$, $\lambda_1$, $\lambda_2$ and $\lambda_3$, respectively. In an embodiment, the scaled log-likelihood ratios for a Turbo decoder are obtained by scaling the demodulated data, which may be obtained by maximal ratio combining, by the square root of $\lambda_k$ instead of by the square root of $P_i$, where k is the subpacket identification number and i is 4, 8, 12 or 16.

For a given payload size, the choices for $\lambda_2$, $\lambda_1$, $\lambda_0$ among the set of four scale factors ($\lambda_3$, $\lambda_2$, $\lambda_1$, $\lambda_0$) may be based on simulation studies or experiments that result in near-optimal choices compared to the ideal case in which exact traffic-to-pilot (T2P) ratios are used for the subpackets. For subpacket id=3, the only choice for the scale factor $\lambda_3$ is $P_{16}$. For the other scale factors $\lambda_2$, $\lambda_1$ and $\lambda_0$, the following procedures may be performed to find near-optimal values based on normalized performance measures such as the ratios of total energy including both pilot symbol energy and data symbol energy ($E_{b,\ total}$) to the noise power spectral density ($N_0$) normalized by the early decoding rates, or alternatively, the data rates normalized by the early decoding rates.

The early decoding rate is the probability of successfully decoding a packet before receiving the entire length of the packet and is understood by a person skilled in the art of hybrid automatic repeat request (ARQ). There may be several early decoding rates for a given packet type. For example, if there are two subpackets in a packet, an early decoding rate is associated with successful decoding after receiving the first subpacket. If a packet consists of three subpackets, there are two early decoding rates, one for successful decoding after receiving the first subpacket and the other for successful decoding after receiving the second subpacket. Each early decoding rate is a distinct probability for each subpacket of a given packet. For example, the early decoding rate for decoding two subpackets early in a packet consisting of three or four subpackets is the conditional probability of decoding after receiving the first two subpackets given that the base station failed to decode the first subpacket.

For a given payload size, the T2P ratios required for achieving a predetermined fixed PER, for example, a PER of 1%, are determined for the first type of packet consisting of one subpacket or four slots, the second type of packet consisting of two subpackets or eight slots, the third type of packet consisting of three subpackets or twelve slots, and the fourth type of packet consisting of four subpackets or sixteen slots. In an embodiment, a priori knowledge of exact T2P ratios to achieve the required PER is used by the base station in the LLR computation. These T2P ratios may be stored in a computer memory at the base station, for example. Each type of packet may be decoded early. For example, an eight-slot packet may be decoded early after four slots but still be capable of achieving a PER of 1%.

In an embodiment, exact T2P ratios are used by the base station to obtain expected performance measures. In the embodiment in which a packet may be any one of the four packet types, four expected performance measures normalized by the early decoding rates are associated with the four packet types, respectively. Based on each T2P ratio required for achieving the predetermined PER for each type of packet, the expected performance measures normalized by the early decoding rates may be calculated from experimental decoding results by decoding the RRI and data channel in a manner known to a person skilled in the art. For the purpose of computing the performance measures, it is assumed that the base station performs a perfect RRI decoding, that is, without any decoding error.

The expected performance measures may be the ratios of total energy including both pilot symbol energy and data symbol energy to the noise power spectral density ($E_{b,\ total}/N_0$) normalized by the early decoding rates for the four types of packets. Alternatively, the expected performance measures may be the data rates achieved at the predetermined PER normalized by the early decoding rates for the four types of packets.

For a given specific payload size, the scale factors $\lambda_2$, $\lambda_1$ and $\lambda_0$ are optimized by trying all possible T2P ratios for each subpacket identification number. For example, for subpacket id=0, one of four possible T2P ratios $P_4$, $P_8$, $P_{12}$ and $P_{16}$ is assigned as $\lambda_0$. For subpacket id=1, one of three possible T2P ratios $P_8$, $P_{12}$ and $P_{16}$ is assigned as $\lambda_1$. For subpacket id=2, one of two possible T2P ratios $P_{12}$ and $P_{16}$ is assigned as $\lambda_2$. For subpacket id=3, $P_{16}$ is assigned as $\lambda_3$. The normalized performance measures for the four types of packets corresponding to the expected performance measures are calculated from the results of decoding the RRI and data channel. The set of T2P ratios which results in normalized performance measures that are the closest to the corresponding normalized expected performance measures is chosen as ($\lambda_3$, $\lambda_2$, $\lambda_1$, $\lambda_0$). Examples of normalized performance measures include the ratios ($E_{b,\ total}/N_0$) normalized by the early decoding rates and the data rates normalized by the early decoding rates. The choices for the scale factors ($\lambda_3$, $\lambda_2$, $\lambda_1$, $\lambda_0$) may also be empirically determined in other manners apparent to a person skilled in the art.

In an embodiment, a set of T2P values ($P_{16}$, $P_{12}$, $P_8$, $P_8$) are selected as near-optimal scale factors ($\lambda_3$, $\lambda_2$, $\lambda_1$, $\lambda_0$), respectively, for a given payload size. In an alternate embodiment, a set of T2P values ($P_{16}$, $P_{16}$, $P_8$, $P_8$) may be selected as near-optimal scale factors ($\lambda_3$, $\lambda_2$, $\lambda_1$, $\lambda_0$), respectively, for a given payload size. It is possible that other choices for a given payload size may also turn out to be near-optimal compared to the ideal situation in which exact T2P ratios are used as scale factors for each subpacket. The near-optimal scale factors $\lambda_0$, $\lambda_1$, $\lambda_2$ and $\lambda_3$, which are associated with subpacket identification numbers 0, 1, 2 and 3, respectively, for a given payload size, are stored as predetermined values in the LLR scale factor LUT 29 associated with the LLR computer 28 at the base station 20. Different sets of near-optimal scale factors ($\lambda_3$, $\lambda_2$, $\lambda_1$, $\lambda_0$), ($\lambda_3'$, $\lambda_2'$, $\lambda_1'$, $\lambda_0'$), ($\lambda_3''$, $\lambda_2''$, $\lambda_1''$, $\lambda_0''$) and so on may also be stored in the LLR scale factor LUT 29 associated with the LLR computer 28 at the base station for different payload sizes.

In an embodiment, the subpacket identification number for each subpacket of a given packet and the payload size of the packet received by the base station are determined by decoding the reverse rate indicator (RRI) channel. The scale factor which is associated with the subpacket identification number and the specific payload size of the packet is applied to the demodulated data symbols within the subpackets of the packet received so far. In an embodiment, the demodulated data symbols are obtained by maximal ratio combining (MRC) demodulation by the demodulator 26 and subsequently scaled by the LLR computer 28 to generate scaled log-likelihood ratios which can be decoded by the Turbo decoder 30. For example, if subpacket id=0, then $\lambda_0$ for the specific payload size is applied to the first subpacket, which is the most recently received subpacket stored in a buffer in the LLR computer 28. If subpacket id=1, then $\lambda_1$ for the specific payload size is applied to the second subpacket, which is the most recently received subpacket, as well as the first subpacket stored in the buffer. If subpacket id=2, then $\lambda_2$ for the specific payload size is applied to the third subpacket, which is the most recently received subpacket, as well as the first and second subpackets stored in the buffer. If subpacket id=3, then $\lambda_3$ for the specific payload size is applied to the fourth subpacket, which is the most recently received subpacket, as well as the first, second and third subpackets stored in the buffer.

Figure 3:
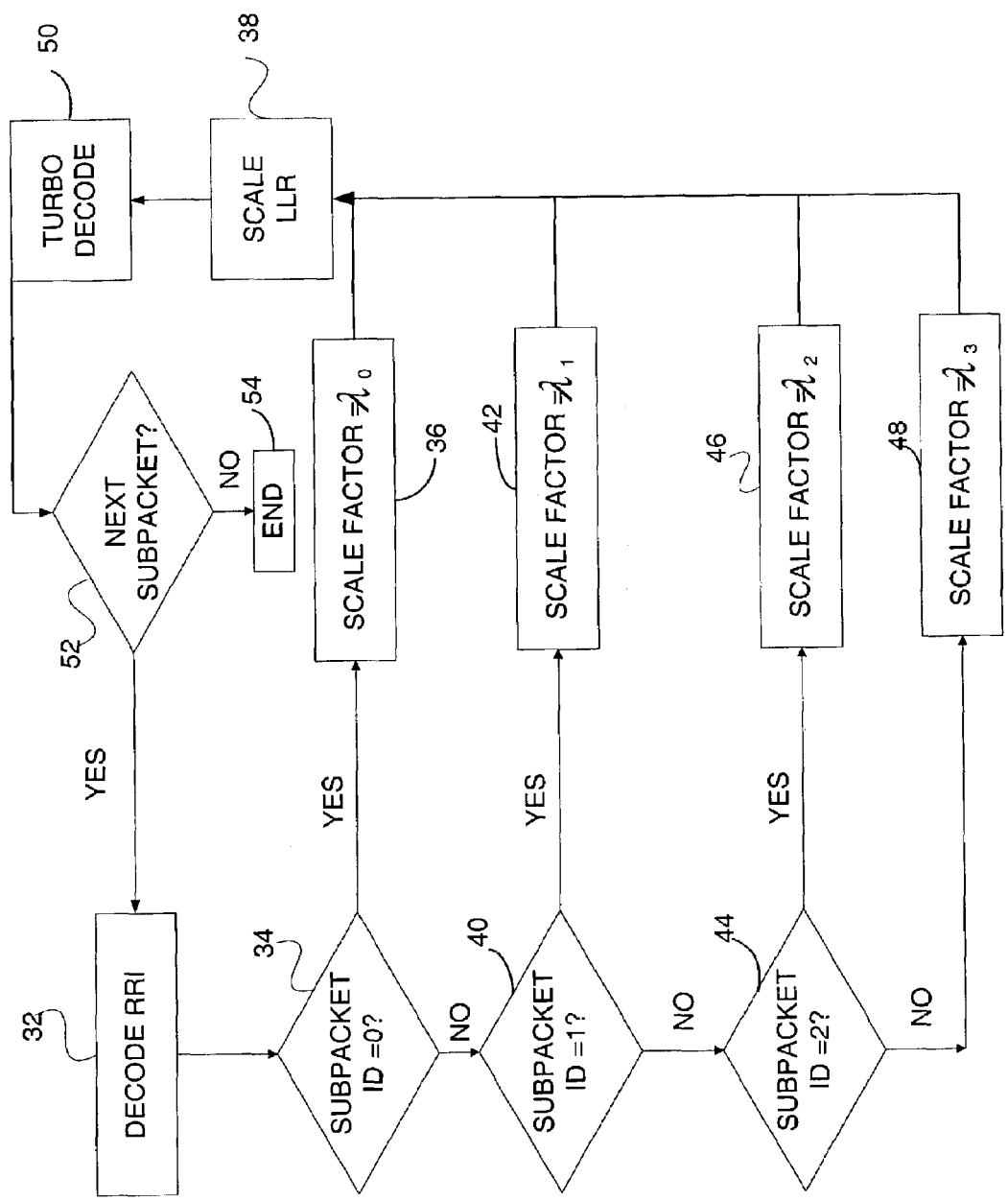
FIG. 3 is a flow chart illustrating an embodiment of process steps implemented for log-likelihood ratio (LLR) computation for a given payload size according to the invention.

FIG. 3 is a flow chart illustrating an exemplary embodiment of process steps implemented for LLR computation for a given payload size according to the present invention. For different payload sizes, different sets of scale factors $\lambda_1$, $\lambda_2$, $\lambda_3$ and $\lambda_4$ are used for LLR computation. At the base station, the subpacket identification number for each subpacket received from the AT is found by decoding the RRI channel as indicated by block 32. If the base station determines that the subpacket identification number is 0 as indicated by block 34, the predetermined value $\lambda_0$ is selected as the scale factor as indicated by block 36 based on the RRI decoding results which include the subpacket identification number and the payload size. The selected scale factor $\lambda_0$ is applied to the MRC-demodulated data in the first and only subpacket of a given packet received so far by the base station to generate scaled LLR values as indicated by block 38.

If the subpacket identification number is not 0, then the base station determines whether the subpacket identification number is 1 as indicated by block 40. If the subpacket identification number is 1, then the predetermined value $\lambda_1$ is selected as the scale factor as indicated by block 42 based on the RRI decoding results which include the subpacket identification number and the payload size. The scale factor $\lambda_1$ is applied to the demodulated data in all of the subpackets of a given packet received so far by the base station to generate scaled LLR values as indicated by block 38.

If the subpacket identification number is neither 0 nor 1, then the base station determines whether the subpacket identification number is 2 as indicated by block 44. If the subpacket identification number is 2, then the predetermined value $\lambda_2$ is selected as the scale factor as indicated by block 46 based on the RRI decoding results which include the subpacket identification number and the payload size. The scale factor $\lambda_2$ is used to scale the demodulated data in all of the subpackets of a given packet received so far by the base station to generate scaled LLR values as indicated by block 38.

If the subpacket identification number is not 0, 1 or 2, then the only possibility for the subpacket identification number is 3, and the predetermined value $\lambda_3$ is selected as the scale factor as indicated by block 48 based on the RRI decoding results which include the subpacket identification number and the payload size. The selected scale factor $\lambda_3$ is used to scale the demodulated data in all of the subpackets of a given packet received so far by the base station to generate scaled LLR values as indicated by block 38. The scaled LLR values are transmitted to a Turbo decoder for decoding as indicated by block 50. If a subsequent subpacket is received by the base station as indicated by block 52, then the RRI channel is decoded for the subsequent subpacket to determine the subpacket identification number as indicated by block 32. If no more subpackets are received by the base station, the process terminates as indicated by block 54.

The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical. Furthermore, numerical ordinals such as "first," "second," "third," etc. simply denote different singles of a plurality and do not imply any order or sequence unless specifically defined by the claim language.

Furthermore, words such as "connect," "connected to" and "connection" used in describing a relationship between different elements do not imply that a direct physical connection must be made between these elements. For example, two elements may be connected to each other physically, electronically, logically, or in any other manner, through one or more additional elements, without departing from the scope of the invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in random access memory (RAM), flash memory, read only memory (ROM), erasable programmable read only memory (EPROM), electrically erasable programmable read only memory (EEPROM), registers, a hard disk, a removable disk, a compact disc-read only memory (CD-ROM), or any other form of storage medium known in the art. An exemplary storage medium is coupled to the processor such that the processor can read information from, and write information to, the storage medium. Alternatively, the storage medium may be integral to the processor. The processor and the storage medium may reside in a single ASIC or as separate components in a base station, for example.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for decoding data in a packet comprising one or more subpackets, the method comprising:
   determining a subpacket identification number for a received subpacket of the packet, the subpacket identification number associated with a scale factor which results in a performance measure that is closest to an expected performance measure;
   applying the scale factor to demodulated data symbols in the packet to generate scaled log-likelihood ratios; and
   decoding the scaled log-likelihood ratios.

2. The method of claim 1, wherein the performance measure comprises a normalized ratio of received energy to noise power spectral density, and wherein the expected performance measure comprises a normalized expected ratio of received energy to noise power spectral density.

3. The method of claim 1, wherein the performance measure comprises a normalized data rate, and wherein the expected performance measure comprises a normalized expected data rate.

4. The method of claim 1, wherein the step of determining the subpacket identification number for the received subpacket comprises decoding a reverse rate indicator (RRI) channel.

5. The method of claim 4, further comprising demodulating received data in the packet by maximal ratio combining (MRC) to generate the demodulated data symbols.

6. The method of claim 5, wherein the step of applying the scale factor comprises scaling the demodulated data symbols by the square root of the scale factor to obtain the scaled log-likelihood ratios.

7. The method of claim 6, wherein said decoding the scaled log-likelihood ratios comprises Turbo decoding the scaled log-likelihood ratios.

8. The method of claim 1, wherein the packet comprises one or more subpackets depending on whether the packet belongs to one of a plurality of predetermined packet types, the method further comprising:
   determining a traffic-to-pilot ratio to achieve a predetermined fixed packet error rate for each of the predetermined packet types; and
   computing the expected performance measure based on the traffic-to-pilot ratio for each of the predetermined packet types.

9. The method of claim 1, wherein:
   the packet comprises one or more subpackets depending on whether the packet belongs to one of a plurality of predetermined packet types; and
   the predetermined packet types consist of first, second, third and fourth packet types, a packet of the first packet type consisting of one subpacket, a packet of the second packet type consisting of two subpackets, a packet of the third packet type consisting of three subpackets, and a packet of the fourth packet type consisting of four subpackets.

10. The method of claim 9, wherein each subpacket consists of four slots.

11. The method of claim 9, wherein a first one of the subpackets in a packet selected from the group consisting of the first, second, third and fourth packet types is assigned subpacket identification number 0, wherein a second one of the subpackets succeeding the first subpacket in a packet selected from the group consisting of the second, third and fourth packet types is assigned subpacket identification number 1, wherein a third one of the subpackets succeeding the second subpacket in a packet selected from the group consisting of the third and fourth packet types is assigned subpacket identification number 2, and wherein a fourth one of the subpackets succeeding the third subpacket in a packet of the fourth packet type is assigned subpacket identification number 3.

12. The method of claim 11, wherein four predetermined scale factors $\lambda_0$, $\lambda_1$, $\lambda_2$ and $\lambda_3$ are associated with the subpacket identification numbers 0, 1, 2 and 3, respectively.

13. The method of claim 12, further comprising storing, at a base station receiving the subpacket in a reverse link, traffic-to-pilot ratios $P_4$, $P_8$, $P_{12}$ and $P_{16}$ for the first, second, third and fourth packet types, respectively.

14. The method of claim 13, further comprising storing the traffic-to-pilot ratios $P_{16}$, $P_{12}$, $P_8$ and $P_8$ as the predetermined scale factors $\lambda_3$, $\lambda_2$, $\lambda_1$ and $\lambda_0$, respectively, prior to said determining the subpacket identification number.

15. The method of claim 13, further comprising storing the traffic-to-pilot ratios $P_{16}$, $P_{16}$, $P_8$ and $P_8$ as the predetermined scale factors $\lambda_3$, $\lambda_2$, $\lambda_1$ and $\lambda_0$, respectively, prior to said determining the subpacket identification number.

16. The method of claim 1, wherein the scale factor is associated with the subpacket identification number and a payload size of the packet obtained by decoding a reverse rate indicator (RRI) channel.

17. A base station apparatus, comprising:
   means for receiving data in a packet consisting of one or more subpackets depending on whether the packet belongs to one of a plurality of predetermined packet types; and
   means for scaling demodulated data symbols in the packet to compute scaled log-likelihood ratios for decoding the data, the means for scaling the demodulated data symbols comprising:
   means for determining a subpacket identification number for a most recently received subpacket of the packet, the subpacket identification number associated with a scale factor which results in a performance measure that is closest to an expected performance measure, and
   means for applying the scale factor to the demodulated data symbols to generate scaled log-likelihood ratios.

18. The apparatus of claim 17, wherein the performance measure comprises a normalized ratio of received energy to noise power spectral density, and wherein the expected performance measure comprises a normalized expected ratio of received energy to noise power spectral density.

19. The apparatus of claim 17, wherein the performance measure comprises a normalized data rate, and wherein the expected performance measure comprises a normalized expected data rate.

20. The apparatus of claim 17, wherein the means for determining the subpacket identification number for the most recently received subpacket comprises means for decoding a reverse rate indicator (RRI) channel.

21. The apparatus of claim 17, further comprising means for demodulating the received data by maximal ratio combining (MRC) to generate the demodulated data symbols.

22. The apparatus of claim 21, wherein the means for applying the scale factor comprises means for scaling the demodulated data symbols by the square root of the scale factor to obtain the scaled log-likelihood ratios.

23. The apparatus of claim 17, farther comprising a Turbo decoder, connected to the means for scaling the demodulated data symbols, to decode the scaled log-likelihood ratios.

24. The apparatus of claim 17, farther comprising:
means for determining a traffic-to-pilot ratio to achieve a predetermined fixed packet error rate for each of the predetermined packet types; and
means for computing the expected performance measure based on the traffic-to-pilot ratio for each of the predetermined packet types.

25. The apparatus of claim 17, wherein the predetermined packet types consist of first, second, third and fourth packet types, a packet of the first packet type consisting of one subpacket, a packet of the second packet type consisting of two subpackets, a packet of the third packet type consisting of three subpackets, and a packet of the fourth packet type consisting of four subpackets.

26. The apparatus of claim 25, wherein each subpacket consists of four slots.

27. The apparatus of claim 25, wherein a first one of the subpackets in a packet selected from the group consisting of the first, second, third and fourth packet types is assigned subpacket identification number 0, wherein a second one of the subpackets succeeding the first subpacket in a packet selected from the group consisting of the second, third and fourth packet types is assigned subpacket identification number 1, wherein a third one of the subpackets succeeding the second subpacket in a packet selected from the group consisting of the third and fourth packet types is assigned subpacket identification number 2, and wherein a fourth one of the subpackets succeeding the third subpacket in a packet of the fourth packet type is assigned subpacket identification number 3.

28. The apparatus of claim 27, wherein four predetermined scale factors $\lambda_0$, $\lambda_1$, $\lambda_2$ and $\lambda_3$ are associated with the subpacket identification numbers 0, 1, 2 and 3, respectively.

29. The apparatus of claim 28, further comprising means for storing traffic-to-pilot ratios $P_4$, $P_8$, $P_{12}$ and $P_{16}$ for the first, second, third and fourth packet types, respectively.

30. The apparatus of claim 29, further comprising means for storing the traffic-to-pilot ratios $P_{16}$, $P_{12}$, $P_8$ and $P_8$ as the predetermined scale factors $\lambda_3$, $\lambda_2$, $\lambda_1$ and $\lambda_0$, respectively.

31. The apparatus of claim 29, further comprising means for storing the traffic-to-pilot ratios $P_{16}$, $P_{16}$, $P_8$ and $P_8$ as the predetermined scale factors $\lambda_3$, $\lambda_2$, $\lambda_1$ and $\lambda_0$, respectively.

32. The apparatus of claim 17, wherein the scale factor is associated with the subpacket identification number and a payload size of the packet obtained by decoding a reverse rate indicator (RRI) channel.

33. The apparatus of claim 17, wherein the means for scaling demodulated data symbols comprises a log-likelihood ratio scale factor look-up table.

34. A computer readable medium having instructions stored thereon that, when executed, decode data in a packet comprising one or more subpackets, the computer readable medium comprising sets of instructions for:
determining a subpacket identification number for a received subpacket of the packet, the subpacket identification number associated with a scale factor which results in a performance measure that is closest to an expected performance measure;
applying the scale factor to demodulated data symbols in the packet to generate scaled log-likelihood ratios; and
decoding the scaled log-likelihood ratios.

35. The computer readable medium of claim 34, wherein the performance measure comprises a normalized ratio of received energy to noise power spectral density, and wherein the expected performance measure comprises a normalized expected ratio of received energy to noise power spectral density.

36. The computer readable medium of claim 34, wherein the performance measure comprises a normalized data rate, and wherein the expected performance measure comprises a normalized expected data rate.

37. The computer readable medium of claim 34, wherein the set of instructions for determining the subpacket identification number for the received subpacket comprises a set of instructions for decoding a reverse rate indicator (RRI) channel.

38. The computer readable medium of claim 37, further comprising a set of instructions for demodulating data in the packet received at the base station by maximal ratio combining (MRC) to generate the demodulated data symbols.

39. The computer readable medium of claim 38, wherein the set of instructions for applying the scale factor comprises a set of instructions for scaling the demodulated data symbols by the square root of the scale factor to obtain the scaled log-likelihood ratios.

40. The computer readable medium of claim 39, wherein the set of instructions for decoding the scaled log-likelihood ratios comprises a set of instructions for Turbo decoding the scaled log-likelihood ratios.

41. The computer readable medium of claim 34, wherein the packet comprises one or more subpackets depending on whether the packet belongs to one of a plurality of predetermined packet types, the computer readable medium further comprising sets of instructions for:
determining a traffic-to-pilot ratio to achieve a predetermined fixed packet error rate for each of the predetermined packet types; and
computing the expected performance measure based on the traffic-to-pilot ratio for each of the predetermined packet types.

42. The computer readable medium of claim 34, wherein:
the packet comprises one or more subpackets depending on whether the packet belongs to one of a plurality of predetermined packet types; and
the predetermined packet types consist of first, second, third and fourth packet types, a packet of the first packet type consisting of one subpacket, a packet of the second packet type consisting of two subpackets, a packet of the third packet type consisting of three subpackets, and a packet of the fourth packet type consisting of four subpackets.

43. The computer readable medium of claim 42, wherein each subpacket consists of four slots.

44. The computer readable medium of claim 42, wherein a first one of the subpackets in a packet selected from the group consisting of the first, second, third and fourth packet types is assigned subpacket identification number 0, wherein a second one of the subpackets succeeding the first subpacket in a packet selected from the group consisting of the second, third and fourth packet types is assigned subpacket identification number 1, wherein a third one of the subpackets succeeding the second subpacket in a packet selected from the group consisting of the third and fourth packet types is assigned subpacket identification number 2, and wherein a fourth one of the subpackets succeeding the third subpacket in a packet of the fourth packet type is assigned subpacket identification number 3.

45. The computer readable medium of claim 44, wherein four predetermined scale factors $\lambda_0$, $\lambda_1$, $\lambda_2$ and $\lambda_3$ are associated with the subpacket identification numbers 0, 1, 2 and 3, respectively.

46. The computer readable medium of claim 45, further comprising a set of instructions for storing traffic-to-pilot ratios $P_4$, $P_8$, $P_{12}$ and $P_{16}$ for the first, second, third and fourth packet types, respectively.

47. The computer readable medium of claim 46, further comprising a set of instructions for storing the traffic-to-pilot ratios $P_{16}$, $P_{12}$, $P_8$ and $P_8$ as the predetermined scale factors $\lambda_3$, $\lambda_2$, $\lambda_1$ and $\lambda_0$, respectively, prior to determining the subpacket identification number.

48. The computer readable medium of claim 46, further comprising a set of instructions for storing the traffic-to-pilot ratios $P_{16}$, $P_{16}$, $P_8$ and $P_8$ as the predetermined scale factors $\lambda_3$, $\lambda_2$, $\lambda_1$ and $\lambda_0$, respectively, prior to determining the subpacket identification number.

49. The computer readable medium of claim 34, wherein the scale factor is associated with the subpacket identification number and a payload size of the packet obtained by decoding a reverse rate indicator (RRI) channel.

50. A base station apparatus comprising:
an antenna coupled to a receiver, the receiver configured to receive data in a packet consisting of one or more subpackets depending on whether the packet belongs to one of a plurality of predetermined packet types;
a demodulator configured to demodulate received data and generate demodulated data symbols;
a log-likelihood ratio (LLR) computer configured to:
determine a subject identification number for a most recently received subpacket of the packet, the subpacket identification number associated with a scale factor which results in a performance measure that is closest to an expected performance measure, and
apply the scale factor to the demodulated data symbols to generate scaled log-likelihood ratios.

51. The apparatus of claim 50, wherein the performance measure comprises a normalized ratio of received energy to noise power spectral density, and wherein the expected performance measure comprises a normalized expected ratio of received energy to noise power spectral density.

52. The apparatus of claim 50, wherein the performance measure comprises a normalized data rate, and wherein the expected performance measure comprises a normalized expected data rate.

53. The apparatus of claim 50, further comprising a decoder configured to decode a reverse rate indicator (RRI) channel for determining the subpacket identification number for the most recently received subpacket.

54. The apparatus of claim 50, wherein the demodulator performs maximal ratio combining (MRC) to generate the demodulated data symbols.

55. The apparatus of claim 54, wherein the LLR computer scales the demodulated data symbols by the square root of the scale factor to obtain the scaled log-likelihood ratios.

56. The apparatus of claim 50, further comprising a Turbo decoder, connected to the LLR computer to decode the scaled log-likelihood ratios.

57. The apparatus of claim 50, wherein the LLR computer further configured to:
determine a traffic-to-pilot ratio to achieve a predetermined fixed packet error rate for each of the predetermined packet types; and
compute the expected performance measure based on the traffic-to-pilot ratio for each of the predetermined packet types.

58. The apparatus of claim 50, wherein the predetermined packet types consist of first, second, third and fourth packet types, a packet of the first packet type consisting of one subpacket, a packet of the second packet type consisting of two subpackets, a packet of the third packet type consisting of three subpackets, and a packet of the fourth packet type consisting of four subpackets.

59. The apparatus of claim 58, wherein each subpacket consists of four slots.

60. The apparatus of claim 58, wherein a first one of the subpackets in a packet selected from the group consisting of the first, second, third and fourth packet types is assigned subpacket identification number 0, wherein a second one of the subpackets succeeding the first subpacket in a packet selected from the group consisting of the second, third and fourth packet types is assigned subpacket identification number 1, wherein a third one of the subpackets succeeding the second subpacket in a packet selected from the group consisting of the third and fourth packet types is assigned subpacket identification number 2, and wherein a fourth one of the subpackets succeeding the third subpacket in a packet of the fourth packet type is assigned subpacket identification number 3.

61. The apparatus of claim 60, wherein four predetermined scale factors $\lambda_0$, $\lambda_1$, $\lambda_2$ and $\lambda_3$ are associated with the subpacket identification numbers 0, 1, 2 and 3, respectively.

62. The apparatus of claim 61, further comprising memory for storing traffic-to-pilot ratios $P_4$, $P_8$, $P_{12}$ and $P_{16}$ for the first, second, third and fourth packet types, respectively.

63. The apparatus of claim 62, further comprising memory for storing the traffic-to-pilot ratios $P_{16}$, $P_{12}$, $P_8$ and $P_8$ as the predetermined scale factors $\lambda_3$, $\lambda_2$, $\lambda_1$ and $\lambda_0$, respectively.

64. The apparatus of claim 62, further comprising memory for storing the traffic-to-pilot ratios $P_{16}$, $P_{16}$, $P_8$ and $P_8$ as the predetermined scale factors $\lambda_3$, $\lambda_2$, $\lambda_1$ and $\lambda_0$, respectively.

65. The apparatus of claim 50, wherein the scale factor is associated with the subpacket identification number and a payload size of the packet obtained by decoding a reverse rate indicator (RRI) channel.

66. The apparatus of claim 50, further comprising a log-likelihood ratio scale factor look-up table connected to the LLR computer.

67. A wireless communication system comprising:
an access terminal;
a base station in communication with the access terminal, the base station comprising:
an antenna coupled to a receiver, the receiver configured to receive data in a packet consisting of one or more subpackets transmitted by the access terminal depending on whether the packet belongs to one of a plurality of predetermined packet types;
a demodulator configured to demodulate received data and generate demodulated data symbols;
a log-likelihood ratio (LLR) computer configured to:
determine a subpacket identification number for a most recently received subpacket of the packet, the subpacket identification number associated with a scale factor which results in a performance measure that is closest to an expected performance measure, and
apply the scale factor to the demodulated data symbols to generate scaled log-likelihood ratios.

* * * * *